United States Patent [19]

Piednoir

[11] Patent Number: 4,967,367
[45] Date of Patent: Oct. 30, 1990

[54] SYNTHETIC NETLIST SYSTEM AND METHOD

[75] Inventor: Jacques-Oliver Piednoir, Valbonne, France

[73] Assignee: VLSI Technology, Inc., San Jose, Calif.

[21] Appl. No.: 273,479

[22] Filed: Nov. 21, 1988

[51] Int. Cl.$^5$ ............................................. G06F 15/60
[52] U.S. Cl. .................................. 364/489; 364/490; 364/900
[58] Field of Search ............... 364/489, 491, 300, 200, 364/900, 578, 490; 324/73 R, 73 AT

[56] References Cited

U.S. PATENT DOCUMENTS

| 4,758,953 | 7/1988 | Morita et al. ........................ 364/300 |
| 4,803,636 | 2/1989 | Nishiyama et al. .................. 364/300 |
| 4,831,543 | 5/1989 | Mastellone ......................... 364/489 |

Primary Examiner—Gary Chin
Assistant Examiner—Ellis B. Ramirez
Attorney, Agent, or Firm—Flehr Hohbach Test Albritton & Herbert

[57] ABSTRACT

A system and method is disclosed for generating a synthetic netlist which mimics the size and complexity of a specified target circuit. The first step of synthetic netlist generation is to generate an abstract of the netlist of a known circuit of the same type as the specified target circuit. Information in the abstract specifies the relative usage rates of the circuit elements in the known circuit and the complexity of the interconnections between circuit elements and circuit signals. The second step is to generate a synthetic netlist, scaled to include a specified number of circuit elements. The circuit elements in the synthetic netlist are interconnected in a sequential process so as to have the interconnection complexity specified by the abstract of the known circuit. While the circuit represented by the resulting synthetic netlist would not perform any useful circuit function, the layout of the synthetic netlist will accurately represent the size and interconnection complexity of the specified target circuit. The synthetic netlist generated by the present invention is suitable for use with a silicon complier so as to generate a circuit layout representative of the specified target circuit.

8 Claims, 7 Drawing Sheets

SYNTHETIC NETLIST SYSTEM AND METHOD

The present invention relates to computer aided design systems for designing integrated circuits, and particularly to a system and method for generating a preliminary circuit netlist which accurately mimics the interconnection and integrated circuit layout characteristics of a target circuit.

BACKGROUND OF THE INVENTION

Virtually all complex integrated circuits are designed with the use of computer aided design (CAD) tools. Some CAD tools, called simulators, help the circuit designer verify the operation of a proposed circuit. Another type of CAD tool, called a silicon compiler, generates the semiconductor mask patterns (herein called the circuit layout) from a detailed circuit specification.

The present invention concerns a new type of computer aided design tool—one which helps circuit designers determine the size and layout floor plan of a circuit well before the details of the circuit have been determined or designed.

The inventor has coined this new tool a "synthetic netlist generator".

Figure 1:
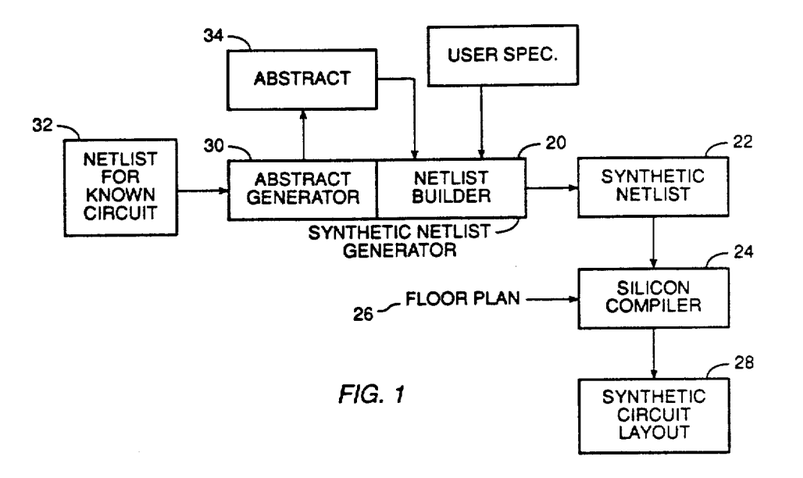
FIG. 1 is a block diagram of role of the present invention in the circuit design process.
Figure 2:
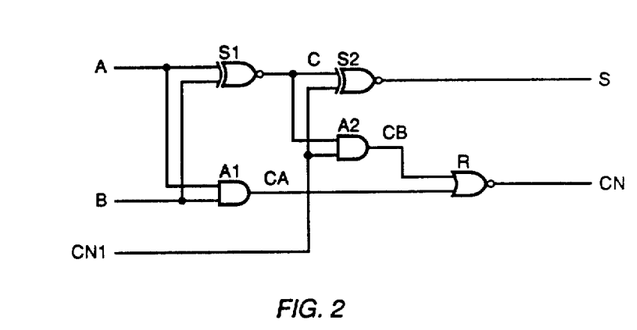
FIG. 2 represents a simple logic circuit.

More particularly, referring to FIG. 1, the present invention 20 generates a "synthetic netlist" 22 (i.e., a kind of "pseudo circuit"), which mimics the characteristics of a specified "target circuit" and is suitable for use with a silicon compiler 24. The silicon compiler 24 combines the synthetic netlist 22 with a specified or predefined floor plan 26 to generate a layout 28 which will have approximately the same size and interconnection complexity as the specified target circuit. The detailed circuit specification used by silicon compilers and circuit simulators is often called a netlist, and comprises a list of circuit components and the interconnections between those components. A netlist for the circuit shown in FIG. 2 is shown in Table 1.

TABLE 1

| Name of Instance | Cell Name | Exemplary Netlist | | | | | |
|---|---|---|---|---|---|---|---|
| | | Input Signals | | | Output Signals | | |
| | | 1 | 2 | 3 | 1 | 2 | 3 |
| S1 | XOR | A | B | | C | | |
| S2 | XOR | C | CN1 | | S | | |
| A1 | AND | A | B | | CA | | |
| A2 | AND | C | CN1 | | CB | | |
| R | NOR | CB | CA | | CN | | |

The netlist defines all of the interconnections between the components of the circuit. Each "signal" which interconnects two or more cells, or which represents an input or output for the entire circuit, is actually a node in the circuit which has been assigned a name. Thus the terms "signal" and "node" are often used interchangeably.

In addition, the netlist specifies the nature of its components by specifying a cell name for each component. The cell name, in turn, specifies or points to a particular circuit in a predefined library of cells.

The problem that the present invention solves is as follows. The most important characteristic affecting the cost of manufacturing any integrated circuit is its size—i.e., the size of the circuit's layout. As a result, circuit designers are intensely interested in determining or estimating the size of the circuits that they are designing before they actually embark on the task of designing the details of the circuit. The reason for this is quite simple: if the circuit will be too large or expensive to manufacture, it is best to know that as soon as possible so that the specification for the circuit can be changed, or the product abandoned before resources have been wasted on an ill conceived product.

Circuit designers are also interested in seeing how different "floor plans" (i.e., schemes for arranging the major components and signal lines of a circuit) affect the size and utilization of the space occupied by any particular circuit before the circuit is designed. The synthetic netlist generated by the present invention is very useful in the "floor planning" process because it enables the circuit designer to test different potential floor plans and thereby select the best floor plan for a specified circuit. The information obtained from such preliminary studies can also change how the circuit will be designed and may even affect the decision as to which features will and will not be included in a particular circuit.

The prior art methods for estimating the size and complexity of a specified target circuit are quite primitive. Generally, these involve the use of very rough "rules of thumb" for scaling up or down the size of a previously designed circuit. In contrast, the present invention enables a relatively precise analysis of a specified target circuit.

SUMMARY OF THE INVENTION

In summary, the present invention is system and method for generating a synthetic netlist which mimics the size and complexity of a specified target circuit. The first step of synthetic netlist generation is to generate an abstract of the netlist of a known circuit of the same type as the specified target circuit. The abstract represents the relative usage rates of the circuit cells in the known circuit and a representation of the complexity of the interconnections between circuit cells and circuit signals. The second step is to generate a synthetic netlist, scaled to include a specified number of cells. The cells in the synthetic netlist are interconnected in a sequential process so as to have the relative distribution of cells and interconnection complexity specified by the abstract of the known circuit. While the circuit represented by the resulting synthetic netlist would not perform any useful circuit function, the layout of the synthetic netlist will accurately represent the size and interconnection complexity of the specified target circuit. That is, the synthetic netlist generated by the present invention is suitable for use with a silicon compiler so as to generate a circuit layout representative of the specified target circuit.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

As explained above, the synthetic netlist generator of the present invention generates "synthetic netlists"—that is, netlists which represent certain characteristics of a specified target circuit. The synthetic netlist represents a circuit having not only a specified number of circuit elements, but also interconnections which mimic the interconnection complexity of the target circuit. As a result, the circuit layout of the synthetic netlist will occupy approximately the same space and fit into a specified floor plan in approximately the same way as the target circuit.

When generating a synthetic netlist having N circuit elements, it is not sufficient to generate a netlist in which those N circuit elements are connected in a random way. For instance, a string of 300 serially connected NAND gates will not occupy the same area as a real netlist of 300 gates.

Referring to FIG. 1, the preferred embodiment generates a synthetic netlist 22 in a two step process. First, an abstract generator 30 analyzes the netlist 32 of a known circuit and generates an abstract 34 which represents a model of the known circuit. The nature of the abstract is discussed in detail in the section of the specification entitled Circuit Abstract.

The second step of the process of generating a synthetic netlist is to use the abstract 34 to generate a new netlist 22 having a selection of circuit elements and a pattern of interconnections in accordance with the model represented by the abstract. That process is described in detail below, in the section of the specification called New Netlist Generation.

Glossary of Circuit Characteristics

The preferred embodiment uses a set of characteristics to "model" known circuits so as to generate an abstract which models the interconnection complexity of those circuits. Before explaining those characteristics, and how they are used to generate a synthetic netlist, several definitions and items of background information are needed.

A "cell library" is a set of predefined circuit elements. Each type of circuit element in the library is called a "cell". More specifically, a cell is defined by a specific circuit layout, a predefined number of input and output signals, and a cell name.

A circuit is specified in a netlist as a set of "instances" and connections between those instances. An "instance" is a particular usage or instance of a cell from a cell library. For example, in a netlist, the following is a specification of a single instance:

A1 AND A B CA

As shown in Table 1, above, this instance has a name, A1. It is an instance of the cell AND, is connected to three input and output signals: A, B, and CA.

When discussing a particular netlist or a particular circuit, the terms instance and circuit element are used interchangeably in this specification.

Any completely specified or "known" circuit contains a certain "distribution" of instances of cells from a corresponding cell library. In simpler terms, a known circuit contains a certain number of instances of each of the cells in a cell library. The "distribution" of instances is the relative numbers of each cell type in the known circuit. A second circuit with the "same distribution" of instances as a first circuit contains the same relative proportions of instances, even though the total numbers of instances in the first and second circuits are different.

Referring to FIG. 2, the term "fanout" refers to the number of cell inputs driven by a particular output signal. For example, the fanout of signal C in FIG. 2 is 2, and the fanout of signal CA is 1.

The term "logic level" refers to the "distance" of each circuit element from the circuit's input signals. All circuit elements which receive primary input signals are at the first logic level. The second logic level comprises those circuit elements not at the first logic level which receive output signals from first level circuits elements.

More generally, the Nth logic level comprises those circuits not in logic levels 1 through $N-1$ which receive output signals generated by circuit elements in logic level $N-1$.

A "one-level" signal is herein defined to mean a signal connected only to circuit elements at the next higher logic level than the logic level of the circuit which generates the signal. Thus a one-level signal does not drive any circuit elements at the logic levels equal to or below the logic level of the circuit which generates the signal.

Finally, two instances are "neighbors" if they are both connected to a signal (i.e., if there is a circuit node to which they are both connected), and two signals are neighbors if there is an instance to which both signals are connected. The number of neighbors for a particular selected instance is the number of instances which are directly coupled to that selected instance by common signals. Similarly, the number of neighbors of a particular signal are the number of signals which are coupled to that selected signal by common cells.

Circuit Abstract

Figure 3:
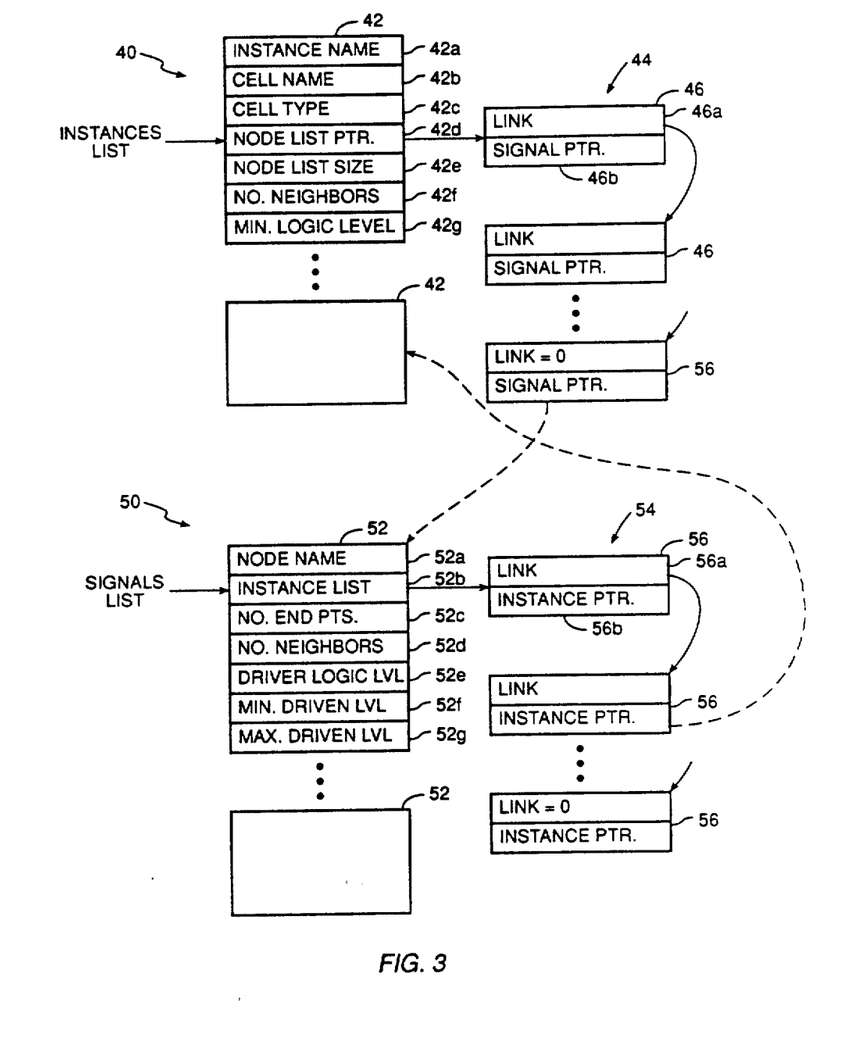
FIG. 3 is a block diagram of the data structure used to represent the netlist of a known circuit.

Referring to FIG. 3, for the purpose of generating a circuit abstract of a known circuit, a representation of the known circuit is stored in two related data structures: an Instances List 40 representing the circuit elements in the known circuit, and a Signals List 50 representing the signal nodes in the known circuit. The Instances List 40 contains one Instance Block 42 for each instance in the known circuit. The Signals List 50 contains one Signal Block 52 for each signal in the known circuit.

Figure 4:
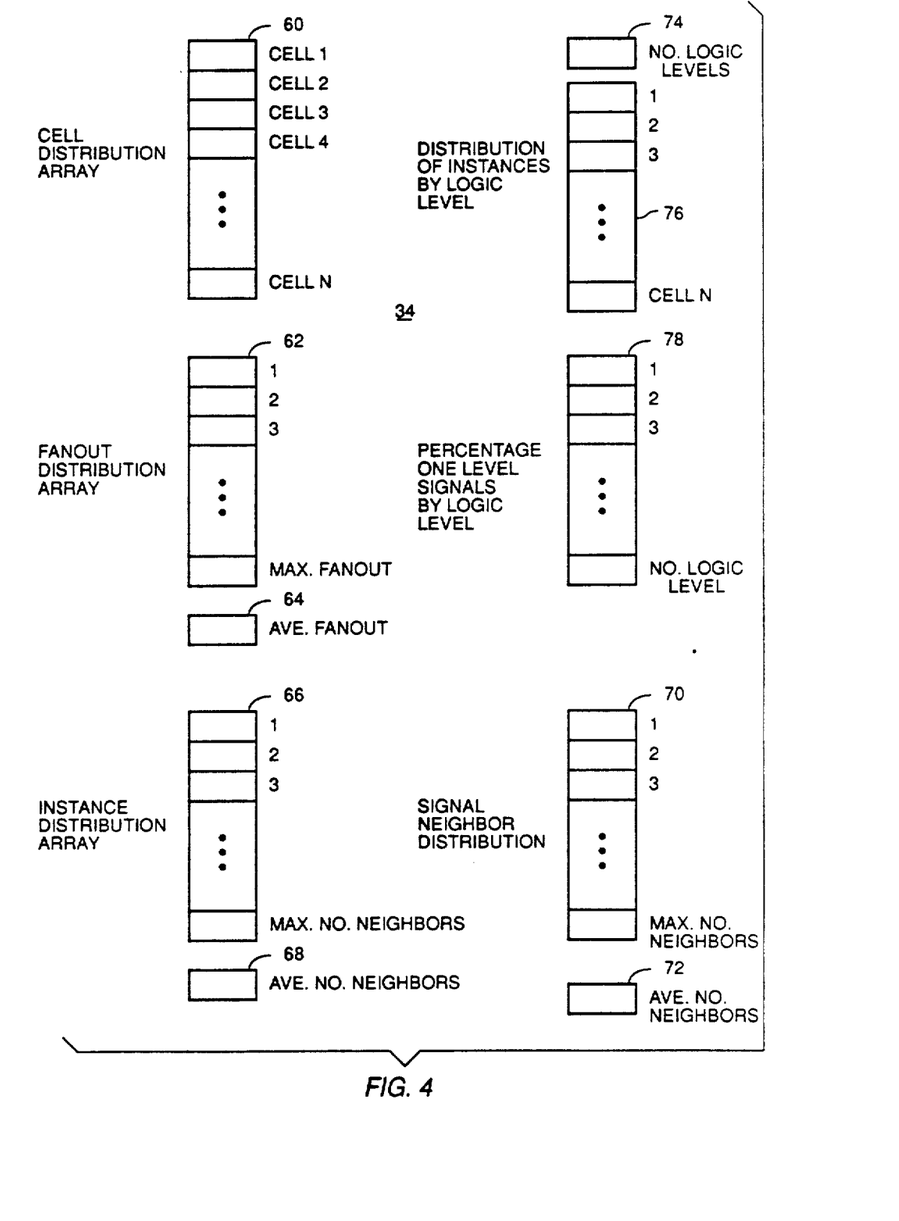
FIG. 4 is a block diagram of the abstract of a known circuit.

The goal of building the data structures in FIG. 3 is to generate data for the Abstract 34 shown in FIG. 4. The data structures which comprise the abstract of a known circuit represent the usage of cells from a specified cell library, the average and distribution of signal fanouts, the average and distribution of the number of neighbors per instance, the average and distribution of the number of neighbors per signal, the number of logic levels, the distribution of instances amongst the logic levels, and distribution of one-level signals amongst the logic levels.

The method of deriving these values, and their significance are described below. Generally, though, the above mentioned data stored in the Abstract 34 has been determined by the inventor to represent the most relevant information for generating a synthetic netlist which mimics the size and interconnection complexity of a specified circuit. When a new netlist is generated using these criteria, it will have similar circuit layout characteristics to circuits of the same general type as the known circuit which was used to generate the Abstract 34. Therefore, when generating any synthetic netlist, the Abstract used to govern the process of generating the netlist should be based on a similar type of circuit. The Abstract for a one type of circuit, such as a disk controller circuit, should be used only to generate synthetic netlists for similar types of circuits.

Figure 5A:
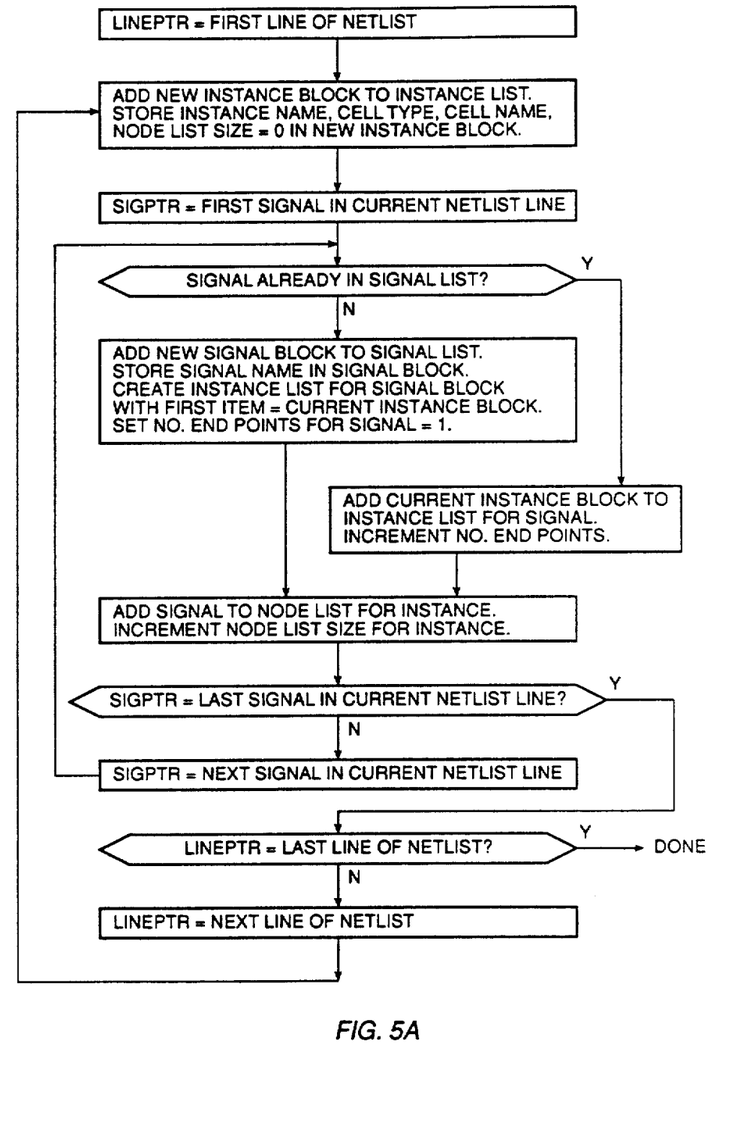
FIGS. 5A and 5B are flow charts of the process of generating an abstract of a known circuit.

At the beginning of the Abstract generation process, the known circuit is initially represented by a netlist, such as the one shown in Table 1. Referring to the flow chart of FIG. 5, the representation of the circuit shown in FIG. 3 is generated by sequentially processing each line of the netlist, where each line represents one instance and the signals connected to it. As will be understood by those skilled in the art, some netlists represent a circuit by a list of all the signals in the circuit and a representation of the instances connected to each signal. The same information can be derived from either type of netlist for storage in the data structures of FIG. 3.

Instance Blocks 42 store the following information: an Instance Name 42a, which is the name of the circuit element; a Cell Name 42b, which designates a cell in a cell library; a Cell Type 42c that points to the cell's external description, which specifies the number of input and output pins and function of the cell; a Node List Pointer 42d, which points to a list of the signals coupled to the instance, herein called a Node List 44; the Node List Size 42e, which is equal to the total number of input and output signals coupled to the instance; the Number of Neighbors 42e of the instance; and the Logic Level 42g associated with the instance.

A Node List 44 is a linked list which represents the signals coupled to an instance. The signals coupled to an instance are specified by pointers to corresponding Signal Blocks 52 in the Signal List 50. That is, instead of storing signal names in the Node List, the list contains pointers to the Signal Blocks 52 for each of those signals. Each item in a Node List 44 is called a Node Block 46, and contains two items: a pointer 46a to the next Node Block 46 in the list, if any; and a pointer 46b to a Signal Block 52 in the Signal List 50.

Signal Blocks 52 store the following information: a Signal Name 52a, which is the name of the node; a pointer 52b to an Instance List 54 (as distinguished from the Instances List 40), which is a list of the instances coupled to the signal node; End Points 52c, which is equal to the fanout of this signal, plus one (for the total number of end points of the signal; the Number of Neighbors 52d of the signal; the signal's Driver Level 52e, which is the logic level associated with the instance that generates this signal; Minimum Driven Level 52f, which is the lowest logic level of the instances driven by this signal; and Maximum Logic Level 52g, which is the Maximum Logic Level of any instance driven by this signal.

An Instance List 54 is a linked list which represents the instances coupled to a signal. The instances coupled to a signal are specified by pointers to corresponding Instance Blocks 42 in the Instances List 40. That is, instead of storing instance names in the Instance List 54, the list contains pointers to the Instance Blocks 42 for each of those instances. Each item in an Instance List 54 is called an Instance List Block 46, and contains two items: a pointer 56a to the next Instance List Block 56 in the list, if any; and a pointer 56b to an Instance Block 42 in the Instances List 40.

FIG. 5A is a flow chart of the process for storing the information in a netlist into the data structures of FIG. 3. Generally, items 42a through 42e in the Instance Block 42 for each instance are obtained directly from the corresponding line of the netlist which represents the known circuit, while Number of Neighbor and Minimum Logic Level items 42f and 42g are values which will be computed during a subsequent pass through the Instances List 40 and Signals List 50.

Similarly, in the Signals List 50, the first three items 52a through 52c for each Signal Block 52 are obtained directly form the netlist, while the Number of Neighbors, Driver Logic Level, Minimum Driven Logic Level and Maximum Driven Logic Level items 52d through 52g are derived during a subsequent pass through the data in these data structures, as described below with reference to FIG. 4.

The logic levels information in the Instances List 40 and Signals List 50 is obtained using a standard "mark propagation" technique to determine which of the instances are at each logic level. Basically, all instances connected to the primary inputs are assigned Logic Level 1 and all other instances are assigned a high Logic Level, such as 10000. Then, all instances driven by the outputs of Logic Level 1 instances, except instances already assigned to Logic Level 1, are assigned Logic Level 2. More generally, all instances driven by the outputs of instances at logic level L are assigned to logic level L+1, except instances already assigned to lower logic levels. This process continues until a logic level is reached which has no instances, at which point all instances have been assigned a logic level.

FIG. 4 shows the data structures for the abstract of a known circuit. Array 60 represents the distribution of cells used in the circuit. The array 60 contains one slot for every cell in a specified cell library. When analyzing the known circuit, all the slots are initially set to zero. For each instance in the known circuit a value of one is added to the slot for the corresponding cell. Finally, the values in the cell distribution array 60 are scaled so as to represent the percentage of instances in the circuit of each cell type. This is done by scaling the values in the cell distribution array 60 for a circuit with one thousand instances. In other words, if the known circuit had 400 instances, each value in the array 60 would be multiplied by 2.5. In the preferred embodiment the values stored in array 60 are integers, rounded to the closest integer value when scaled, but could be stored as real numbers in other embodiments.

Fanout Distribution array 62 has N slots, where N is the maximum fanout of all the signals in the known circuit. Each slot in the array 62 represents the number of signals with a corresponding fanout. Thus the first slot represents the number of signals with a fanout of one, the second slot represents the number of signals with a fanout of two, and so on. The values in this array are computed by clearing the array, reading the fanout (i.e., number of end points) value for each signal in the Signal List 50 (see FIG. 3), and adding a value of one to the slot for the corresponding fanout value. These values are then scaled for a circuit with one thousand signals so that the values in the array 62 represent the percentage of signals with each fanout value.

Element 64 in the abstract represents the average fanout (i.e., number of end points) for all of the signals in the known circuit, and is computed at the same time that the fanout distribution is computed.

Instance Neighbor Distribution array 66 represents the distribution of the number of neighbors in the known circuit. To compute the values for this array 66, the Number of Neighbors 42f for each instance in the Instance List 40 must be computed. The Number of Neighbors for a selected is computed as follows. The idea is to generate a list (called Neighbor_List) of all the instances coupled to the selected instance by a single common signal. Therefore, for each of the signals in the instance's Node List 44, the procedure is to read that signal's Instance List 54 and add to the Neighbor_List all of the Instances not already on the Neighbor_List. After this is done for all of the signals on the instance's Node List 44, the number of instances in the Neighbor_list is equal to the number of neighbors for the selected instance. This value is stored in the Number of Neighbors slot 42f for the selected instance, and the corresponding slot (i.e., for that Number of Neighbors value) in the Instance Neighbor Distribution array 66 is incremented. After the Number of Neighbors has been computed for all of the instances in the circuit, the values in the Instance Neighbor Distribution array 66 are scaled or normalized for a circuit with 1000 elements.

Figure 5B:
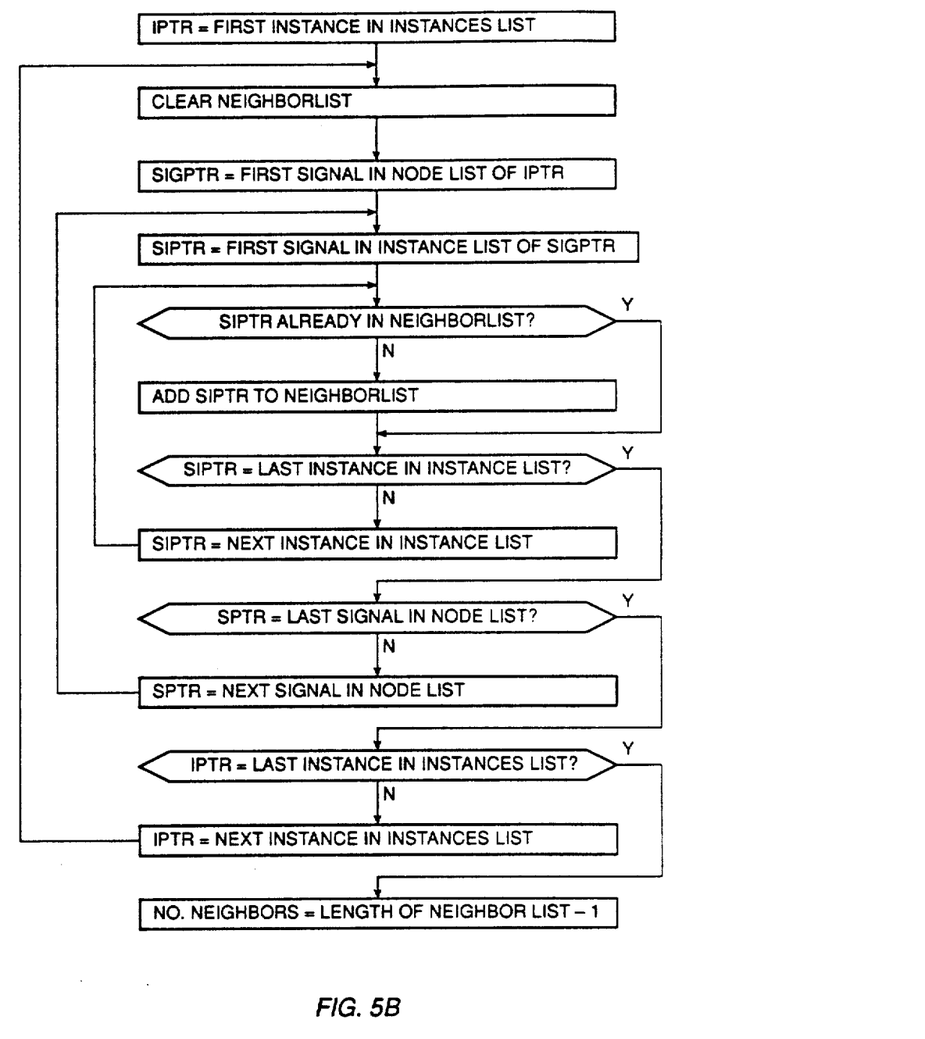

Element 68 in the Abstract 34 represents the average Number of Neighbors for all the instances in the known circuit, and is computed at the same time that the Number of Neighbors distribution is computed. FIG. 5B is a flow chart of the process for computing the Number of Neighbors values for instances.

The values stored in the Signal Neighbor Distribution array 70, and Average Number of Signal Neighbors 72 are calculated in the same was as the Instance Neighbor Distribution array, except that the calculation is based on the number of neighboring signals instead of instances.

The process for determining the number of logic levels (stored in element 74 of the abstract) and the logic levels
for each instance is described above. As the logic levels of the instances are determined, the values for a Distribution of Instances by Logic Level array 76 are also computed. That is, once the logic level of a selected instance has been determined, the slot in array 76 for that logic level is incremented. In addition, after the logic level for each instance is determined, the Driver Logic Level (52e in FIG. 3) of that instance's output signals are also set to that logic level value. After the logic level has been computed for all of the instances in the circuit, the values in the Distribution of Instances by Logic Level array 76 are scaled or normalized for circuit with 1000 elements.

Finally, all the signals in the Signal List 50 are reviewed to determine the number of "one-level" signals at each logic level. A one-level signal is one for which:
Minimum Driven Logic Level=Driver Logic Level+1
and Maximum Driven Logic Level=Driver Logic Level+1
That is, all the instances driven by the signal are at the logic level that is one higher than the instance which generates that signal.

Array 78, which is initially cleared, is used to record the number of one-level signals at each logic level. The first slot of array 78 is used to record the number of one-level signals at logic level one, the second slot is used for logic level two, and so on. Note that a signal is "at" the logic level of the instance which generates that signal.

To find the one-level signals, the Minimum Driven Logic Level and Maximum Driven Logic Level parameters 52f and 52g are computed for each of the Signal Blocks 52 in the Signal List 50. The process for doing this for one selected signal is as follows. Looking at each of the instances in the Instance List 54 for the selected signal, the Minimum Driven Level 52f is equal to the lowest logic level of the instances in that list (excluding the instance that generates the selected signal), and the Maximum Driven Level 52g is the highest logic level of the instances in that list. Note that the Maximum Driven Level 52g cannot be greater than the Driver Level+1 of the signal, but can be smaller than that Driver Level.

If the resulting Minimum and Maximum Driven Logic Level values meet the criteria for a one-level signal, the value in array 78 for the signal's logic level is incremented. After processing all of the signals in Signal List 50 in this way, the values in array 78 for each logic level are separately scaled so that each value in array 78 represents the percentage of signals at that logic level which are one-level signals.

The last two parameters stored in the Abstract 34 are the number of primary inputs to the entire known circuit 80, and the number of output signals (i.e., output to output pins for the entire known circuit) 81. These values are not scaled, because the number of primary input and output signals is often not proportional to the size of the circuit. It should be noted that most types of circuit netlists have a predefined syntax for denoting primary input and output signals, making it a simple matter to determine the number of such signals.

Synthetic Netlist Generation

Figure 6:
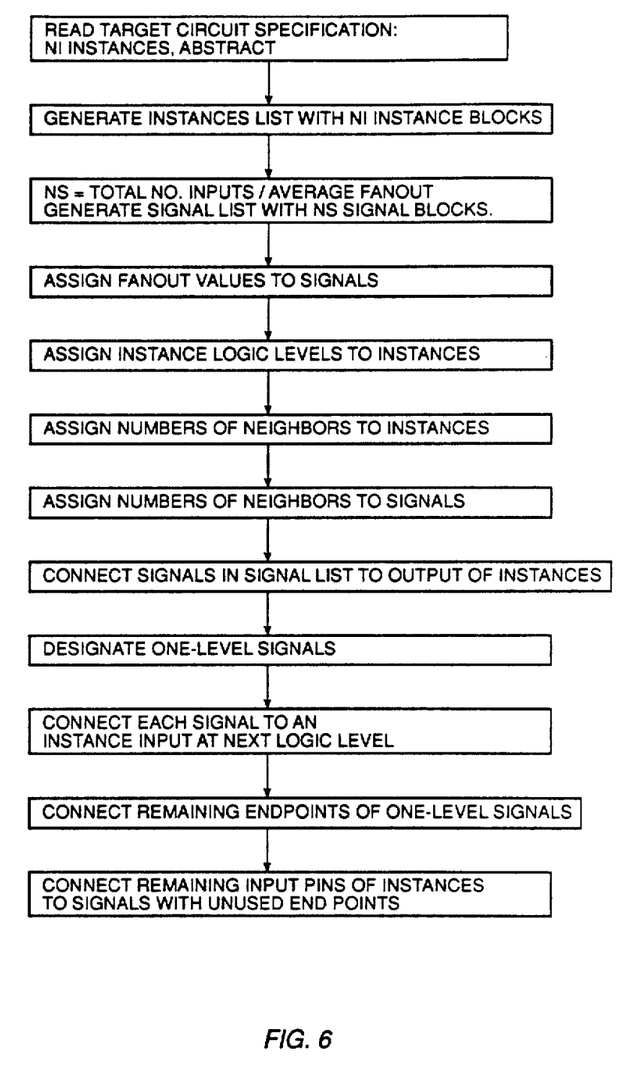
FIG. 6 is a flow chart of the process of generating a synthetic netlist from an abstract of a known circuit.

Referring to FIG. 6, the basic starting point for generating a synthetic netlist is an Abstract of a known circuit, and a specified number of instances. That is, the "size" of the specified or target circuit is denoted by the specified number of instances, and the nature or type of the specified circuit is denoted by the Abstract. The circuit specification also includes a specification of the number of primary input and output signals for the circuit. If the number of primary input and output signals are not specified, the values stored in the Abstract 80 and 81 are used to determine the number of primary input and output signals to be used in the synthesized or target circuit.

Note that each of the steps in FIG. 6 is done in accordance with data in the Abstract, as explained in more detail below.

From the specification of the target circuit (i.e., the specified size and Abstract), the synthetic netlist generator first generates a set of unconnected instances, equal in number to the specified number of instances. The cell types of the instances are selected in accordance with the values in the Cell Distribution Array 60 in the Abstract. For instance, if the target circuit has 750 instances, then the number of instances which will assigned each cell type of cell will be 0.75 times the corresponding value in the Cell Distribution Array 60.

Figure 7:
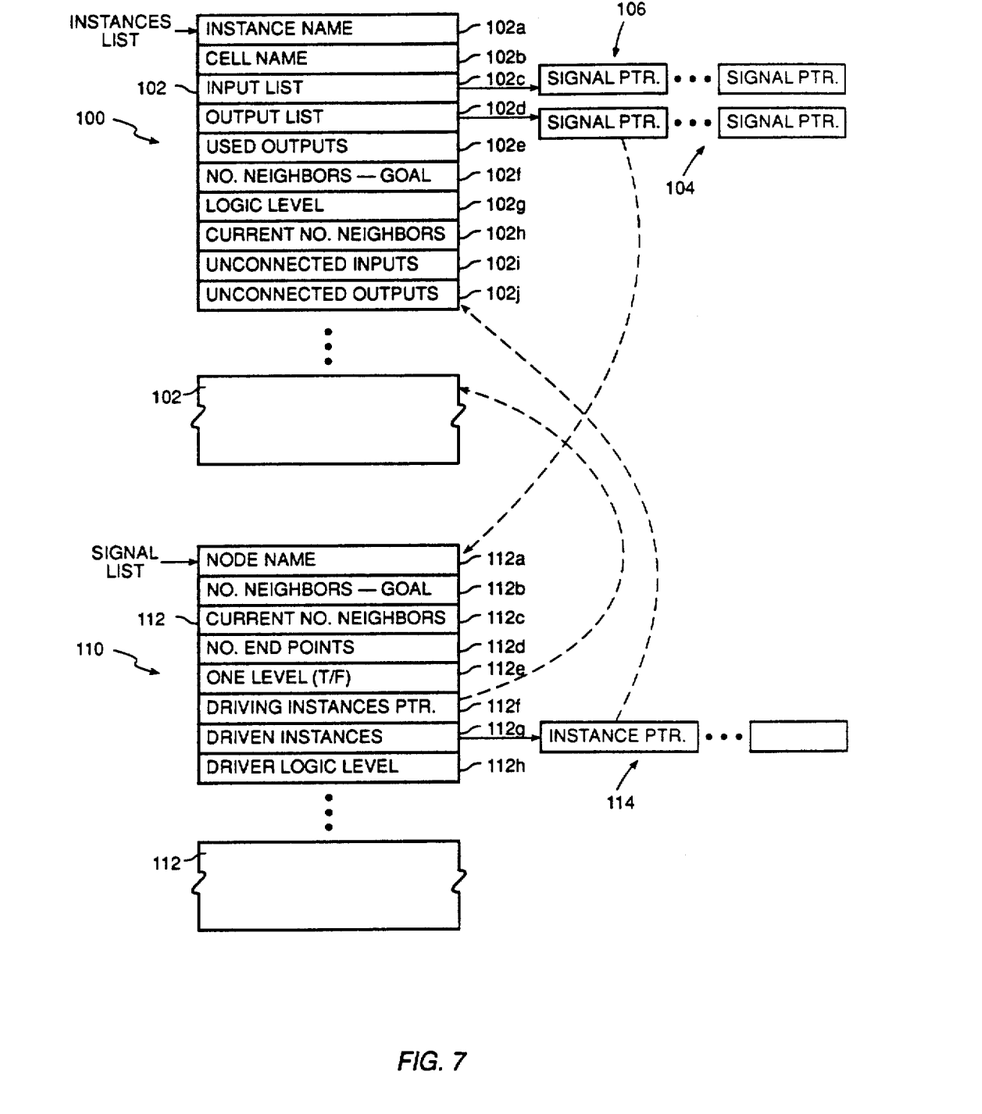
FIG. 7 is a block diagram of the data structures used to represent a synthetic netlist as it is being generated.

Referring to FIG. 7, the instances generated for the synthetic netlist are represented by an Instances List 100 which is somewhat different from the one shown in FIG. 3. One Instance Block 102 is generated for each instance in the target circuit, and the Cell Types 102b for these instances are selected from the specified cell library in accordance with the ratios of the values in the Cell Distribution Array 60. Instance names 102a are assigned in an arbitrary fashion, such as taking the first letter of the cell name for the instance's cell type, and then appending to that letter a unique integer. In addition, the Unconnected Inputs slot 102i of each instance is set equal to the number of input pins associated with its designated cell type.

At this point, the other slots 102c through 102h and 102j in the Instance Blocks 102 have assigned values of zero.

Input and Output Connector Instances. In addition to the instances generated as described above, the synthetic netlist generator also generates a set of "input connector" and "output connector" instances. Each input connector instance has only one output pin and no input pins. Each output connector instance has only one input pin and no output pins. The number of input connector instances is equal to the specified number of primary input signals for the target circuit, and the number of output connector instances is equal to the specified number of output signals for the target circuit.

Generate Signals. The next step is to determine the number of output signals that will be generated by the instances in the Instance List 100, and to assign those signals to output pins of selected instances. A certain number of output pins is associated with each cell type in the cell library, and thus with each instance in the Instance List 100. However, many circuits do not use all the output pins of their instances. Thus, the total number of output pins for the instances in the Instance List 100 only determines the maximum number of signals in the synthetic netlist.

The preferred number of signals that will be used in the synthetic netlist is set equal to the number of input pins for all the instances, divided by the average fanout, which is specified by element 64 in the Abstract. If this value is greater than the total number of output pins (this almost never happens), the number of signals will be set equal to the total number of output pins. Otherwise, the number of signals in the circuit is set to the preferred number, calculated as described above, and there will be a number of unconnected output pins.

A Signal List 110 is generated for the calculated number of signals, with one Signal Node 112 for each signal. These signals are then assigned Node Names 112a (in an arbitrary fashion). At this time, the signals are not connected to any of the instances. The process of interconnecting signals and instances is discussed below in the section entitled Generate Interconnects.

However, the number of used output pins for each instance is assigned at this time and stored in slot 102j, representing the number of unconnected outputs for the instance. The assignment of output pins is made so that every instance has at least one output signal, and then randomly, with the only requirements being that the number of output signals for an instance cannot exceed its number of output pins, and that the total number of used output pins must equal the number of signals. Note that input connector instances have just one output pin, and therefore each input connector instance will be assigned a signal.

Assign Fanouts to Signals. After generating the Signal List 110, the Number of End Points value 112d for each signal is randomly assigned, using values obtained from the Fanout Distribution Array 62 of the Abstract, so that the distribution of fanout values for the signals is in proportion to the values in the Fanout Distribution Array 62.

One way to do this is as follows. A copy of the Fanout Distribution Array 62 is generated, with values scaled to the specified number of signals in the Signal List 112. The copy of array 62 defines the set of available fanout values. Then, the set of available fanout values is randomly assigned to the signals in the Signal List 112.

Assign Instance Logic Levels. Using the Distribution of Instances by Logic Level array 76 in the Abstract, logic levels are randomly assigned to the instances in the Instance List 100 in such as way that the distribution of logic level values for the signals is in proportion to the values in the Distribution of Instances by Logic Level array 76. The assigned logic level value for each instance is stored in slot 102g of the corresponding Instance Block 102. A procedure equivalent to the one described above for assigning fanout values can be used for this purpose.

Input connector instances are assigned to a logic level that is one level below the lowest logic level for other instances, and output connector instances are assigned to a logic level that is one level above the highest logic level for other instances. Note that element 74 in the Abstract 34 specifies the number of logic levels.

Assign Number of Neighbors to Instances. Values are assigned to the Number of Neighbors 102f of each Instance Block 102 so that the distribution of values is in accordance with the Instance Neighbor Distribution array 66 in the Abstract. That is, values between 1 and Max Neighbors (for instances) are randomly assigned to the instances in the Instances List 100, with the distribution of values being weighted or governed by the Instance Neighbor Distribution array 66 in the Abstract. Input connector instances are assigned a Number of Neighbors equal to the Average Fanout value from element 64 in the Abstract. Output connector instances are not assigned a Number of Neighbors value Assign Number of Neighbors to Signals. Using the same procedure as just described by Instance Neighbors, values are assigned to the Number of Neighbors 112b of each Signal Block 112 so that the distribution of values is in accordance with Signal Instance Neighbor Distribution array 70 in the Abstract. The primary input signals, which have a Logic Driver Level not represented by array 70, are assigned a Number of Neighbors value equal to the Average Fanout value, from element 64 in the Abstract, multiplied by NP−1, where NP is the average number of pins per instance.

Generate Interconnects. At this point, all of the instances and signals have been assigned logic levels, number of neighbors, cell types, fanouts and related characteristics, but no signal connections have been made. The process of generating signal interconnections is designed to follow certain criteria, including the fanout values, logic level values, and number of neighbor values already assigned.

More particularly, for each signal n there is an associated fanout value F(n) and a number of neighbors NNs(n) which correspond to the values in slots 112d and 112b in the corresponding signal block 112. For each instance i there is an associated number of neighbors NNi(i) which corresponds to the value in slot 102f (Target Number of Neighbors), and a number of pins (i.e., pins to be used) NP(i) which corresponds to the sum of the initial values Number of Unused Inputs 102i and Number of Unused Outputs 102j of the Instance Block 102. These are "goal" or target values which the interconnection will try to achieve while interconnecting instances.

The interconnection process also keeps track of the current fanout Cf(n) and the current number of neighbors CNNs(n) of each signal n, and the current number of used pins CNP(i) and the current number of neighbors CNNi(i) of each instance i.

When generating interconnections, as will be described in more detail below, it is necessary to make selections as to which instances are to be interconnected with other instances. Furthermore, it is necessary to make these selections so as that the resulting netlist will have the distributions of Number of Neighbors, fanouts, and pin usage which fit the values in the Abstract.

To select an instance for connecting to another instance, or to select a signal to be connecting to an instance's input pin, a set of "cost functions" are used to determine which instance or signal is the best choice. Two of the cost functions are designed so that the candidate with the "lowest cost" is the best choice; the other cost function used in the preferred embodiment is designed so that the candidate with the "highest cost" is the best choice for making the synthetic netlist match the circuit model in the Abstract.

The three cost functions used in the preferred embodiment are described in the following description of the interconnection process.

Assigning Signals. The first step of the interconnection process is to assign each signal in the Signal List 110 to the output pin of a selected instance in the Instances List 100. The method of selecting which signal should be assigned to each used output pin is as follows. The process proceeds sequentially through the Instances List 100, assigning a signal to each used output pin for each instance. To assign a signal to a particular output pin of an instance, a cost function $\Gamma_1$ is computed for all of the unassigned signals (i.e., signals which have not yet been assigned a Driving Instance). The signal with the lowest value for $\Gamma_1$ is the one that is assigned to the output pin.

The $\Gamma_1$ cost function is defined as follows:
i identifies the instance
n identifies the signal being considered
$\Phi$ is the average fanout
$\psi$ is the average number of input pins per instance $$IF(i) = \text{ideal fanout value for selected signal}$$
$$= NNi(i) - [(Np(i) - 1) * \Phi]$$

$$INN(i) = \text{ideal number of neighbors for selected signal}$$
$$= (IF(i) - 1)*\psi + NP(i) - 1$$

$$\Gamma_1(n) = 2*|IF(i) - f(n)| + |INN(i) - NNs(n)|$$

In other words, the $\Gamma_1$(n) cost function is a weighted sum of the difference between the ideal and actual fanout values for the signal n, and the difference between the ideal and actual number of neighbors for the signal n.

When a signal is selected and assigned to an instance's output pin, a pointer to the instance is stored in Driving Instance slot 112f of the signal block 112, the Driver Logic Level 112h is set equal to the instance's Logic Level 102g, and a pointer to the signal block 110 for that signal is added to the output signal list 104 for the instance. The output signal list 104 is a linked list of pointers to signal blocks 112. The beginning of the output signal list is specified by the Output List pointer in slot 102d of the Instance Block 102.

Assign One-Level Signals. Using the Percentage of Instances by Logic Level array 78 in the Abstract, the One Level Flag 112e of a specified percentage of the signals at each Driver Logic Level is set equal to True. The one-level signals for each logic level are selected randomly. A procedure for doing this for the signals at each logic level is as follows. If there are N signals at this logic level, and M are to be made one-level signals, then M random numbers are selected between 1 and N and the corresponding signals, in accordance with their sequential order in the Signal List, are denoted as one-level signals.

In addition, all primary input signals, which are connected to the output pins of the input connector instances, are by definition one-level signals and therefore have their One Level Flag 112e set to True.

One to One Interconnects. The second step of the interconnection process is to connect each signal to an instance at a logic level one higher than its Driver Logic Level. In other words, if the signal's Driver Logic Level is equal to L, the signal is connected to an instance at level L+1.

For each signal in the Signal List 110 (including the primary input signals, but not including the signals at the highest logic level, as discussed below), all the instances at level L+1 (where L is the logic level of the signal's Driver Logic Level 112h) are checked by computing a cost function $\Gamma_2$. The instance with the lowest value for $\Gamma_2$ is the one selected for connection to the signal.

The $\Gamma_2$ cost function, for signal n and instance i, is defined as follows:

$$INP(i) = \text{ideal number of pins for instance } i$$
$$= NNs(n) - (CNNs(n) + (f(n) - Cf(n) - 1)*\psi)$$

$$INN(i) = \text{ideal number of neighbors for instance } i$$
$$= (INP(i) - 1)*\Phi + f(n)$$

$$\Gamma_2(i) = 2*|INN(i) - NNi(i)| + |INP(i) - NP(i)|$$

The $\Gamma_2$ cost function, as applied to an instance i, is a weighted sum of the difference between the ideal and actual number of neighbors for the instance i, and the difference between the ideal and actual number of used pins for the instance i.

Signals output by instances at the highest logic level are handled somewhat differently. In particular, each of these signals is connected to one of the output connector instances until all of the output connector instances have been used. If there are more signals at the highest logic level than there are output connector instances, then some of these signals must be connected to inputs at lower logic levels (selected using the $\Gamma_2$ cost function), but this is usually not necessary.

Whenever an instance is selected for connection to a particular signal, a pointer to the selected instance is added to the signal's Instance List 114, and a pointer to the signal n is added to the selected instance's input signal list 106. In addition, the number of Unconnected Inputs in slot 102i for the selected instance is decreased, and the values of the Current Number of Neighbors 102h of the selected instance and 112c of the signal n are recomputed to account for the new connection just made.

These updates of data in the Instances List 100 and Signals List 110 are also made whenever a new connection is made during the interconnection steps described below.

One-Level Signal Interconnects. As described above, before generating interconnects, the synthetic netlist generator denotes a certain number of the signals as one-level signals by setting the One Level Flag 112d in the corresponding signal blocks. The third step of the interconnection process is to connect the remaining unconnected endpoints of each one-level signal to an instance at a logic level one higher than its Driver Logic Level.

In other words, if a particular one-level signal has a Driver Logic Level of L and has X end points 112d, and X is greater than two, the remaining X-2 endpoints of the signal are connected to instances at level L+1. The instance to be connected to each of the X-2 endpoints is selected using cost function $\Gamma_2$. Thus, for each endpoint, all of the instances at logic level L+1 are tested using cost function $\Gamma_2$, and the instance with the lowest $\Gamma_2$ value is selected.

Multilevel Interconnects. The last step of the interconnection process is to connect the remaining unconnected input pins of each instance to the output pin of an instance at a higher logic level.

Note that it may not be possible to find an appropriate instance at a higher logic level because (a) there is no higher logic level, or (b) all the endpoints of the signals at the appropriate Driver Logic Level have been used. In these cases, a signal at a lower Driver Logic Level is selected, and the Logic Level 102g of the instance which drives the selected signal is changed.

It should be noted that there are, in general, fewer instances at the highest logic level than at the previous ones. As a result, there is a good probability that all the input pins of the instances at the highest logic level will have been connected before the multilevel interconnect step. Thus it is usually not necessary to connect the input pins of the instances at the highest logic level to outputs from lower logic levels (which would reset those instances to lower logic levels).

A third cost function, $\Gamma_3$, is used to select the best signal n for connection to the unused input pin of an instance i. The signal with the highest $\Gamma_3$ value is selected.

Cost function $\Gamma_3$, used to find a signal n to connect to the input pin of an instance i, is defined as follows:

$$\Gamma_3 = f(n) - Cf(n)$$

In other words, if instance i is at logic level L, all the signals with Driver Logic Level 112h higher than L (and at least one unused end point) are evaluated with the $\Gamma_3$ cost function and the signal n with largest differential between its target fanout f(n) and its current fanout Cf(n) is the one selected.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

For example, the parameters stored in the Abstract to represent known circuits could be varied in a number of ways without fundamentally changing the nature of the synthetic netlist generator. Changes in the Abstract such as adding data regarding input and output signals, or storing Number of Neighbor distributions only for instances or only for signals, would still permit the generation of a synthetic netlist that mimics the size and interconnection complexity of a specified circuit. Furthermore, the preferred method of generating a synthetic netlist from a size specification and Abstract is but one of many methods of generating a synthetic netlist that will have a specified cell distribution, signal fanout distribution, and number of neighbors distribution.

What is claimed is:

1. A synthetic netlist generator, comprising:
   abstract means for receiving a specified netlist representing a known circuit, said specified netlist including a representation of the interconnections between a specified set of circuit elements in said known circuit, and for generating an abstract representing the circuit elements used, the distribution of circuit elements and the complexity of the interconnections between said circuit elements in said known circuit; and
   netlist means for receiving said abstract and generating a new, synthetic circuit netlist, said synthetic circuit netlist representing a set of selected circuit elements with selected interconnections therebetween, said set having a specified number of circuit elements, wherein the circuit elements used, the distribution of said selected circuit elements and the complexity of the selected interconnections therebetween are in accordance with said abstract.

2. The synthetic netlist generator of claim 1, said known circuit having circuit elements distributed over a plurality of logic levels, said abstract means including means for generating an abstract representing the number of logic levels in said known circuit and the distribution of circuit elements among said logic levels, said abstract means further including means for determining the number of circuit neighbors for each circuit element in said known circuit and for including in said abstract a representation of the distribution of the number of circuit neighbors for the circuit elements in said known circuit.

3. The synthetic netlist generator of claim 2, said netlist means including means for generating a list having a specified number of circuit elements, the distribution of said selected circuit elements being in accordance with said abstract, and for then generating representations of interconnections of said circuit elements in said list, said interconnections being selected so that said synthetic circuit netlist represents a circuit having the same number of logic levels s said known circuit and so that the distribution of circuit elements among said logic levels and the distribution of the number of circuit neighbors for the circuit element in said synthetic circuit netlist are in accordance with said abstract.

4. The synthetic netlist generator of claim 3, said interconnections in said known circuit comprising signals, each said signals having an associated fanout,
   said abstract means including means for determining the fanout of each said signal in said known circuit and for including in said abstract a representation of the distribution of fanout values for the signals in said known circuit;
   said netlist means including means for generating representations of signals interconnecting said circuit elements in said list, said signal interconnections being selected so that the distribution of fanout values among said signals is in accordance with said representation of the distillation of fanout values in said abstract.

5. A method of generating a synthetic netlist, comprising the steps of:
receiving a specified netlist representing a known circuit, said specified netlist including a representation of the signal interconnections between a specified set of circuit elements in said known circuit, said known circuit having circuit elements distributed over a plurality of logic levels;
generating an abstract representing the circuit elements used, the distribution of circuit elements, the complexity of the interconnections between said circuit elements in said known circuit, and the number of logic levels in said known circuit;
generating a new, synthetic netlist having a specified number of circuit elements, the circuit elements used and the distribution of said circuit elements being in accordance with said abstract; and
generating signal interconnections of said circuit elements in said synthetic netlist so as to represent a circuit having the number of logic levels specified in said abstract, and selecting said signal interconnections so that the complexity of the selected interconnections between said circuit elements are in accordance with said abstract.

6. The method of claim 5, said step of generating an abstract further including the steps of determining the number of circuit neighbors for each circuit element in said known circuit and generating a representation in said abstract of the distribution of the number of circuit neighbors for the circuit elements in said known circuit;
said netlist generating step including the step of selecting said signal interconnections so that the distribution of the number of circuit neighbors for the circuit elements in said synthetic netlist is in accordance with said abstract.

7. The method of claim 6, said signal interconnections in said known circuit comprising signals, each having an associated fanout;
said step of generating an abstract further including the steps of determining the fanout of each said signal in said known circuit and for including in said abstract a representation of the distribution of fanout values for the signals in said known circuit;
said signal interconnection generating step including the step of selecting said signal interconnections so that the distribution of fanout values among said signal interconnections in said synthetic netlist is in accordance with said representation of the distribution of fanout values in said abstract.

8. A method of generating a synthetic netlist, comprising the steps of:
receiving a specified netlist representing a known circuit having a multiplicity of circuit elements, said specified netlist further representing signals interconnecting said circuit elements; said known circuit having circuit elements distributed over a plurality of logic levels;
generating an abstract representing the circuit elements used, the distribution of circuit elements, the complexity of the interconnections between said circuit elements in said known circuit, the number of logic levels in said known circuit, and the distribution of said circuit elements among said logic levels;
generating a synthetic netlist having a specified number of circuit elements, the circuit elements used, the distribution of said circuit elements being in accordance with said abstract; and
generating signal interconnections of said circuit elements in said synthetic netlist so as to represent a circuit having the number of logic levels specified in said abstract, and selecting said signal interconnections so that the complexity of the selected interconnections between said circuit elements and the distribution of circuit elements among said logic levels are in accordance with said abstract.

* * * * *

UNITED STATES PATENT AND TRADEMARK OFFICE
CERTIFICATE OF CORRECTION

PATENT NO. : 4,967,367

DATED : 10/30/90

INVENTOR(S) : Jacques-Oliver Piednoir

It is certified that error appears in the above-identified patent and that said Letters Patent is hereby corrected as shown below:

ON TITLE PAGE:  Item [75[  should read;

Jacques-Olivier Piednoir

Signed and Sealed this

Thirty-first Day of March, 1992

Attest:

HARRY F. MANBECK, JR.

*Attesting Officer*  *Commissioner of Patents and Trademarks*